(12) United States Patent
Sotani

(10) Patent No.: US 6,559,034 B2
(45) Date of Patent: May 6, 2003

(54) METHOD OF FABRICATING SEMICONDUCTOR DEVICE

(75) Inventor: Naoya Sotani, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/091,429

(22) Filed: Mar. 7, 2002

(65) Prior Publication Data

US 2002/0164864 A1 Nov. 7, 2002

(30) Foreign Application Priority Data

Mar. 27, 2001 (JP) ........................... 2001-089422

(51) Int. Cl.⁷ ................... H01L 21/46; H01L 21/78; H01L 21/301
(52) U.S. Cl. ........................... 438/463; 438/482
(58) Field of Search ................... 438/96, 97, 329, 438/330, 382, 463, 469, 482, 491, 507, 522

(56) References Cited

U.S. PATENT DOCUMENTS 5,012,212 A * 4/1991 Matsui et al.
5,837,331 A * 11/1998 Menu et al.
6,239,451 B1 * 5/2001 Fonash et al.

* cited by examiner

*Primary Examiner*—David Nelms
*Assistant Examiner*—Phuc T. Dang
(74) *Attorney, Agent, or Firm*—McDermott, Will & Emery

(57) ABSTRACT

A method of fabricating a semiconductor device capable of improving productivity by efficiently polycrystallizing an amorphous silicon film is obtained. This method of fabricating a semiconductor device comprises steps of forming an amorphous film on a substrate, forming a conductor film on the substrate, arranging the substrate so that the surface of the conductor film is substantially parallel to an electric field in a waveguide and irradiating the conductor film with an electromagnetic wave thereby making the conductor film generate heat and crystallizing the amorphous film with the heat. Thus, the substrate is arranged to be substantially parallel to the electric field in the waveguide, whereby the absorptivity of the conductor film for the electromagnetic wave is improved and hence the conductor film can be efficiently heated. Thus, crystallization is performed in a short time, thereby improving productivity. The amorphous film is indirectly homogeneously heated through the conductor film having stable absorptivity regardless of the surface state of the amorphous film, whereby the yield is improved in crystallization of the amorphous film.

12 Claims, 8 Drawing Sheets

POSITION OF
ABSORPTION FILM

METHOD OF FABRICATING SEMICONDUCTOR DEVICE

BACKGROUND OF THE INVENTION

1. Field of the Invention

The present invention relates to a method of fabricating a semiconductor device, and more particularly, it relates to a method of fabricating a semiconductor device such as a thin-film transistor.

2. Description of the Prior Art

In relation to a liquid crystal display recently rapidly coming into wide use, it is required to prepare a thin-film transistor (hereinafter referred to as a polycrystalline silicon TFT) employing a polycrystalline silicon film formed on a substrate as an active layer at a low cost, in order to provide a lightweight and compact display of high performance at a low cost. In general, the maximum temperature in a fabrication process for a polycrystalline silicon TFT is reduced from about 1000° C. to not more than about 600° C., thereby enabling employment of a low-priced glass substrate in place of a high-priced quartz substrate. The fabrication process for a polycrystalline silicon TFT employing the low-priced glass substrate is generally referred to as a low-temperature process.

In relation to the conventional low-temperature process, known is excimer laser annealing (ELA) for crystallizing an amorphous silicon film employed as a starting material thereby forming a polycrystalline silicon film. In this ELA, the amorphous silicon film is irradiated with a short-wave laser beam of about 200 nm having high absorptivity for the amorphous silicon film or a polycrystalline silicon film by pulse oscillation of several 100 ns, thereby heating the amorphous silicon film or the polycrystalline silicon film to a high temperature and performing crystallization.

In the conventional ELA, however, beam intensity is dispersed due to instability of the pulse oscillation, and hence it is difficult to uniformly perform heating. Therefore, the yield is reduced to disadvantageously reduce productivity.

SUMMARY OF THE INVENTION

An object of the present invention is to provide a method of fabricating a semiconductor device capable of improving productivity by efficiently polycrystallizing an amorphous silicon film.

Another object of the present invention is to improve the yield in crystallization of the amorphous silicon film in the aforementioned method of fabricating a semiconductor device.

A method of fabricating a semiconductor device according to an aspect of the present invention comprises steps of forming an amorphous film on a substrate, forming a conductor film on the substrate, arranging the substrate so that the surface of the conductor film is substantially parallel to an electric field in a waveguide, and irradiating the conductor film with an electromagnetic wave thereby making the conductor film generate heat and crystallizing the amorphous film with the heat.

In the method of fabricating a semiconductor device according to this aspect, the substrate is so arranged that the surface of the conductor film is substantially parallel to the electric field in the waveguide as hereinabove described thereby improving absorptivity of the conductor film with respect to the electromagnetic wave, whereby the conductor film can be efficiently heated. Thus, crystallization can be performed in a short time, thereby improving productivity. When a conductor film having stable absorptivity is employed, the amorphous film can be uniformly heated regardless of the surface state thereof due to indirect heating through the conductor film having stable absorptivity, whereby the yield can be improved in crystallization of the amorphous film. The productivity can be improved also according to this.

In the aforementioned method of fabricating a semiconductor device according to this aspect, the step of arranging the substrate preferably includes a step of arranging the substrate on a position separated from a reflecting end surface for the electromagnetic wave at an interval of substantially odd times $\lambda/4$ assuming that $\lambda$ represents the wavelength of the electromagnetic wave. According to this structure, the absorptivity of the conductor film for the electromagnetic wave is further improved, whereby the conductor film can be more efficiently heated.

In the aforementioned method of fabricating a semiconductor device including the step of arranging the substrate on the position separated from the reflecting end surface for the electromagnetic wave at the interval of substantially odd times $\lambda/4$, the reflecting end surface for the electromagnetic wave may include a reflector provided to block an end of the waveguide. The step of arranging the substrate preferably includes a step of arranging the substrate while interposing a spacer member, transparent with respect to the electromagnetic wave, having a thickness of substantially odd times $\lambda/4$. According to this structure, the substrate can be readily arranged on the position separated from the reflecting end surface for the electromagnetic wave at the interval of substantially odd times $\lambda/4$.

In the aforementioned method of fabricating a semiconductor device including the step of arranging the substrate on the position separated from the reflecting end surface for the electromagnetic wave at the interval of substantially odd times $\lambda/4$, the step of crystallizing the amorphous film preferably includes steps of arranging an electromagnetic convergent lens on the forward end of the waveguide and irradiating the surface of the conductor film with the electromagnetic wave converged by the electromagnetic convergent lens. According to this structure, the conductor film can be concentrically irradiated with a linear or point electromagnetic wave. In this case, the step of crystallizing the amorphous film may include steps of setting a reflector reflecting the electromagnetic wave and irradiating the reflector with the electromagnetic wave converged by the electromagnetic convergent lens and moving the substrate in parallel with the reflector while maintaining a distance of substantially odd times $\lambda/4$ from the reflector for the electromagnetic wave. According to this structure, crystallization can be continuously performed over the entire conductor film, whereby crystallization can be readily performed also on a large-sized substrate.

In the aforementioned method of fabricating a semiconductor device including the step of arranging the substrate on the position separated from the reflecting end surface for the electromagnetic wave at the interval of substantially odd times $\lambda/4$, the step of crystallizing the amorphous film preferably includes a step of providing a slit in the waveguide and linearly emitting the electromagnetic wave from the slit of the waveguide thereby irradiating the surface of the conductor film with the electromagnetic wave. According to this structure, the conductor film can be readily concentrically irradiated with a linear electromagnetic wave. In this case, the step of crystallizing the amorphous film includes steps of setting a reflector reflecting the electromagnetic wave and irradiating the reflector with the electromagnetic wave linearly emitted from the slit of the waveguide and moving the substrate in parallel with the reflector while maintaining a distance of substantially odd times λ/4 from the reflector for the electromagnetic wave. According to this structure, crystallization can be continuously performed over the entire conductor film, whereby crystallization can be readily performed also on a large-sized substrate.

In the aforementioned method of fabricating a semiconductor device including the step of arranging the substrate on the position separated from the reflecting end surface for the electromagnetic wave at the interval of substantially odd times λ/4, the step of crystallizing the amorphous film preferably includes a step of providing an opening for passing the substrate therethrough on the waveguide, providing a choke structure in the vicinity of the opening and inserting the substrate from the opening and passing the substrate through the waveguide while maintaining a distance of substantially odd times λ/4 from the reflecting end surface for the electromagnetic wave. In this case, the structure provided with the opening for passing the substrate therethrough can be rendered equivalent to that provided with no opening in view of a high-frequency circuit due to the choke structure. Thus, no leakage of a microwave or the like may be taken into consideration also when the opening is provided. When the substrate is inserted from the opening and passed through the waveguide, crystallization can be continuously performed over the entire conductor film, whereby crystallization can be readily performed also on a large-sized substrate.

In the aforementioned method of fabricating a semiconductor device according to this aspect, the step of crystallizing the amorphous film preferably includes steps of forming the waveguide by folding a linear waveguide a plurality of times while providing a plurality of openings for passing the substrate therethrough on high-field portions of the side surface of the waveguide and moving the substrate to pass through the plurality of openings. According to this structure, the conductor film of the substrate can be continuously irradiated with the electromagnetic wave, whereby the conductor film can be efficiently heated. Thus, crystallization can be performed in a short time, thereby improving productivity.

In the aforementioned method of fabricating a semiconductor device according to this aspect, the step of crystallizing the amorphous film preferably includes a step of irradiating the conductor film with a pulsing electromagnetic wave thereby making the conductor film generate heat and crystallizing the amorphous film with the heat. When the conductor film is thus irradiated with the pulsing electromagnetic wave, crystallization can be performed by short-time heating.

In the aforementioned method of fabricating a semiconductor device according to this aspect, the step of crystallizing the amorphous film preferably includes a step of irradiating the conductor film with the electromagnetic wave while moving at least either the substrate formed with the conductor film or the electromagnetic wave thereby making the conductor film generate heat and crystallizing the amorphous film with the heat. According to this structure, crystallization can be readily continuously performed over the entire conductor film.

In the aforementioned method of fabricating a semiconductor device according to this aspect, the electromagnetic wave preferably includes a microwave, and the conductor film preferably includes a resistor film. In this case, the resistor film can be readily heated with the microwave.

In the aforementioned method of fabricating a semiconductor device according to this aspect, the conductor film may include a polysilicon film. Further, the amorphous film may include an amorphous silicon film.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

(First Embodiment)

A fabrication process for a semiconductor device according to a first embodiment of the present invention is described with reference to FIGS. 1 to 7.

Figure 1:
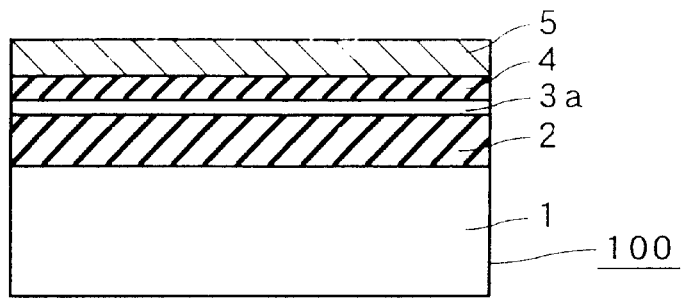
FIGS. 1 and 2 are sectional views for illustrating a method of fabricating a semiconductor device according to a first embodiment of the present invention.

First, a sample 100 shown in FIG. 1 was prepared in relation to the first embodiment. More specifically, a buffer layer 2 of $SiO_2$ having a thickness of 400 nm was formed on a glass substrate 1 by plasma CVD (chemical vapor deposition). An amorphous silicon film 3a having a thickness of 75 nm was formed on the buffer layer 2 by low-pressure CVD under conditions of material gas of $SiH_4$ and a temperature of 550° C. Further, an insulator film 4 of $SiO_2$ having a thickness of 100 nm and an amorphous silicon film having a thickness of 100 nm were formed by plasma CVD. $P^+$ ions were implanted into the amorphous silicon film by ion implantation followed by activation and crystallization by ELA, thereby forming an absorption film 5 consisting of doped polysilicon. According to the first embodiment, the absorption film (resistor) 5 was formed to have sheet resistance of 550Ω/ and 250Ω/ by implanting $P^+$ ions into the amorphous silicon film with doses of $1.5 \times 10^{15}$ $cm^{-2}$ and $2.5 \times 10^{15}$ $cm^{-2}$. Then, the sample 100 shown in FIG. 1 was cut into 15 mm square (15 mm by 15 mm). The glass substrate 1 is an example of the "substrate" according to the present invention. The amorphous silicon film 3a is an example of the "amorphous film" according to the present invention, and the absorption film 5 is an example of the "conductor film" according to the present invention.

A microwave absorption mechanism of the absorption film 5 is now described. A dielectric material, a resistor or a magnetic substance absorbs a microwave. A microwave absorption mechanism formed by a resistor is optimum as a material for absorbing a microwave in a method of fabricating a semiconductor device. In the microwave absorption mechanism formed by the resistor, the resistor is arranged in an electric field formed by a microwave so that a current (charges) resulting from the electric field flows through the resistor according to the Ohm's law. Thus, the resistor generates heat. The microwave forms an alternating field in the resistor, and hence an alternating current is maintained. Thus, the resistor can be efficiently heated by irradiating the same with the microwave.

An experimental device employed in the first embodiment is described with reference to FIG. 3. This experimental device comprises a rectangular waveguide 6, a microwave oscillator 8, an isolator 9, a matcher 10 and a shutter 11. The microwave oscillator 8 oscillates a microwave applied to the absorption film 5 of the sample 100. This microwave oscillator 8 can vary microwave oscillation power between 0.5 kW and 5.0 kW (set to 4.6 kW in the first embodiment). The isolator 9 prevents a returning microwave from returning to the microwave oscillator 8. The matcher 10 matches the microwave. The oscillated microwave is applied to the absorption film 5 of the sample 100 stored in the rectangular waveguide 6 through the isolator 9, the matcher 10 and the shutter 11. In this case, the quantity of the microwave applied to the absorption film 5 is controlled by opening/closing the shutter 11. However, the shutter 11 employed in the first embodiment, confirmed as transmitting about 15% of the microwave in a closed state, is not complete. The rectangular waveguide 6 is an example of the "waveguide" according to the present invention.

Figure 3:
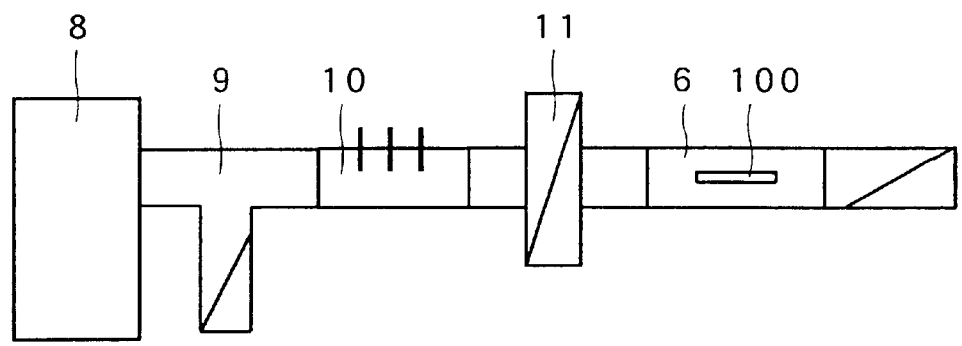
FIG. 3 schematically illustrates the overall structure of an experimental device employed for the first embodiment of the present invention.
Figure 4:
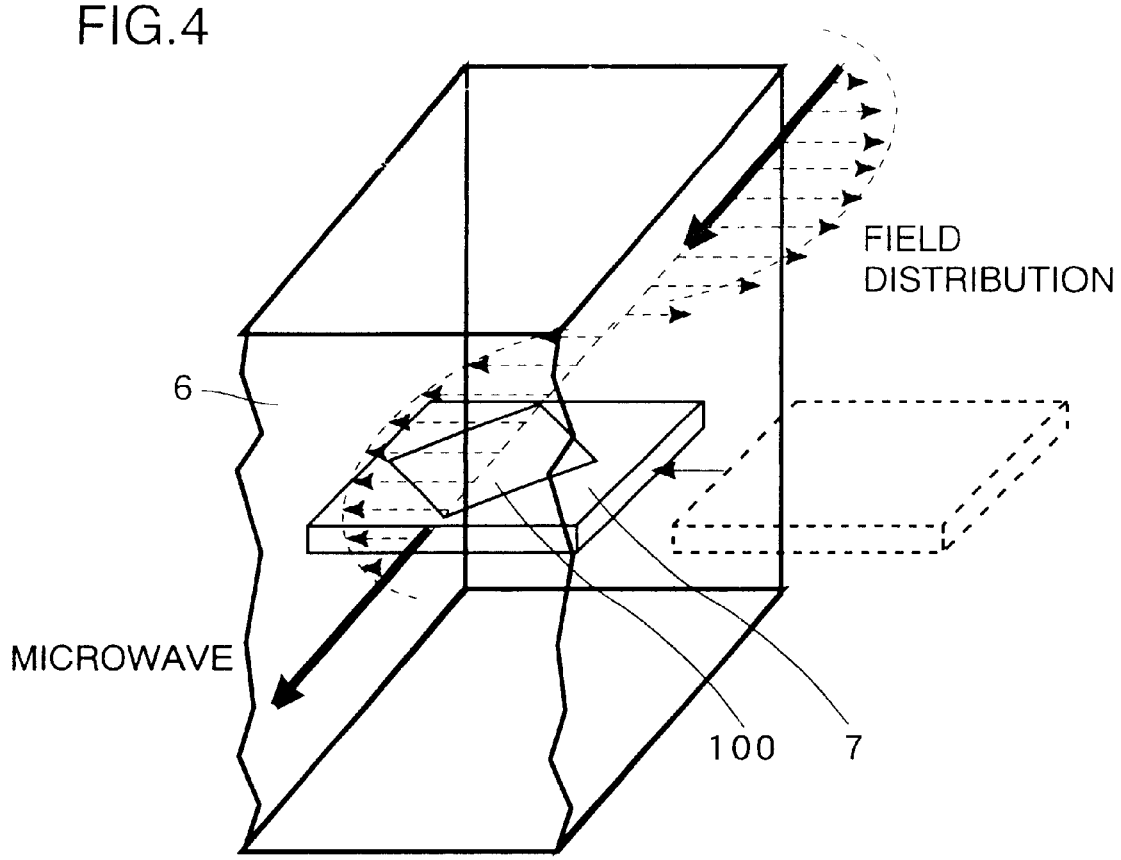
FIGS. 4 and 5 are schematic diagrams for illustrating the method of fabricating a semiconductor device according to the first embodiment of the present invention.
Figure 5:
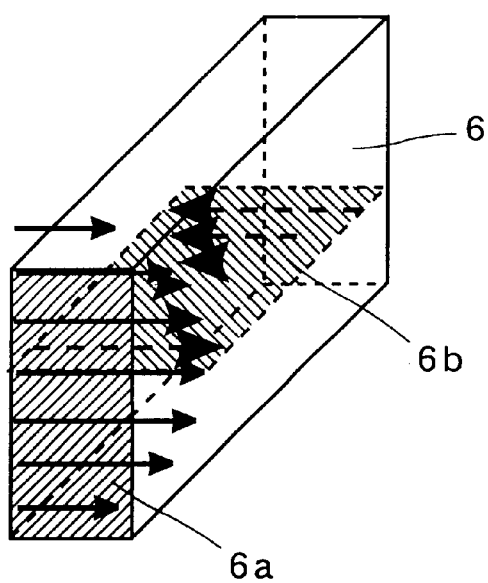

FIG. 4 shows the rectangular waveguide 6 of the experimental device shown in FIG. 3 in detail. According to the first embodiment, the aforementioned sample 100 was placed on a sample holder 7 of Teflon, which in turn was introduced into the rectangular waveguide 6 as shown in FIG. 4. Teflon is transparent with respect to a microwave. The direction and the position for introducing the sample 100 are described with reference to FIG. 5. When a microwave is oscillated in the rectangular waveguide 6, field distribution resulting from the microwave is present along planes 6a and 6b, as shown by arrows in FIG. 5. When the sample 100 is so arranged that the surface of the absorption film 5 is in parallel with the plane 6a or 6b, therefore, the surface of the absorption film 5 can be arranged to be substantially parallel to the electric field in the rectangular waveguide 6. Thus, a current flows through the absorption film 5 in parallel with the surface thereof, whereby the absorption film 5 can efficiently absorb the microwave.

Figure 2:
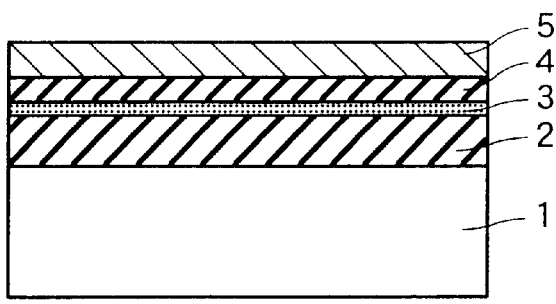

According to the first embodiment, the sample 100 was arranged in parallel with the plane 6b, and thereafter irradiated with the microwave with power of 4.6 kW. Thus, the absorption film 5 generated heat due to the applied microwave, and the heat emitted from the absorption film 5 diffused into the insulator film 4, to be substantially uniformly transmitted to the amorphous silicon film 3a. Consequently, the amorphous silicon film 3a was substantially uniformly annealed and homogeneously crystallized with no dispersion. Thus, a polycrystalline silicon film 3 was formed as shown in FIG. 2.

Figure 6:
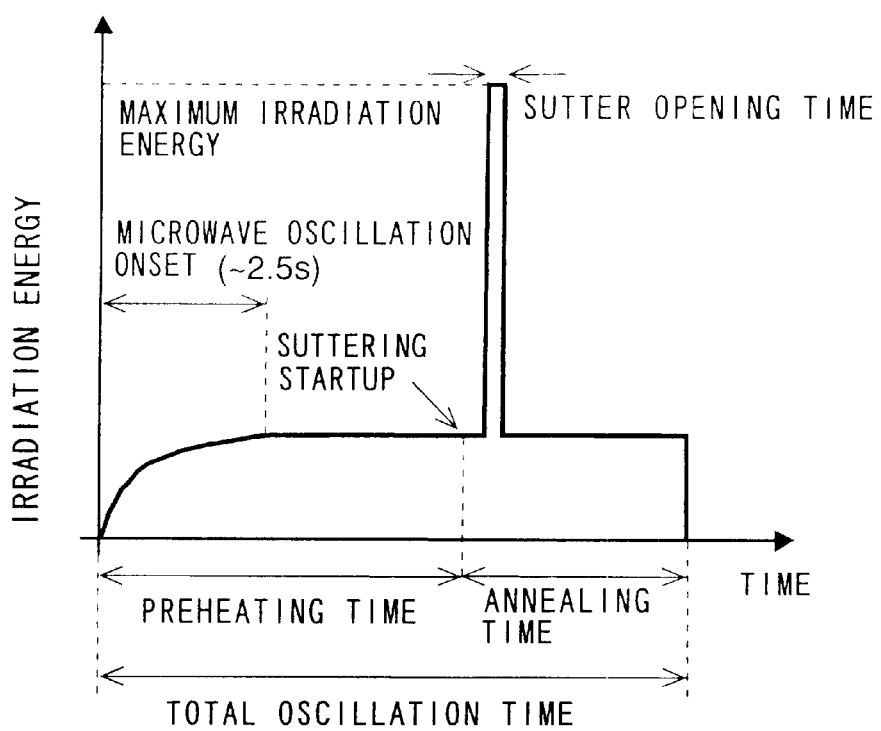
FIG. 6 is a correlation diagram for illustrating the method of fabricating a semiconductor device according to the first embodiment of the present invention.

FIG. 6 shows the process of irradiating the sample 100 with the microwave in the first embodiment in detail. Time change of the microwave applied to the sample 100 is described with reference to FIG. 6. According to the first embodiment, four points of a microwave oscillation output of the microwave oscillator 8, a preheating time from starting of microwave oscillation to starting of a shutter cylinder operation, a shutter cylinder speed and an annealing time from starting of the shutter cylinder operation to stopping of microwave oscillation were employed as parameters. The maximum irradiation energy was controlled by the microwave oscillation output. A time of about 2.5 sec. is required for the onset of microwave oscillation. After a lapse of the preheating time from microwave oscillation, the shutter cylinder starts its operation thereby opening/closing the shutter 11 (see FIG. 3). When the microwave irradiation energy is remarkably increased, the shutter 11 is opened. The opening time for the shutter 11 depends on the operating speed of the shutter cylinder. When the annealing time elapses from starting of the shutter cylinder operation, the output of the microwave is stopped.

Figure 7:
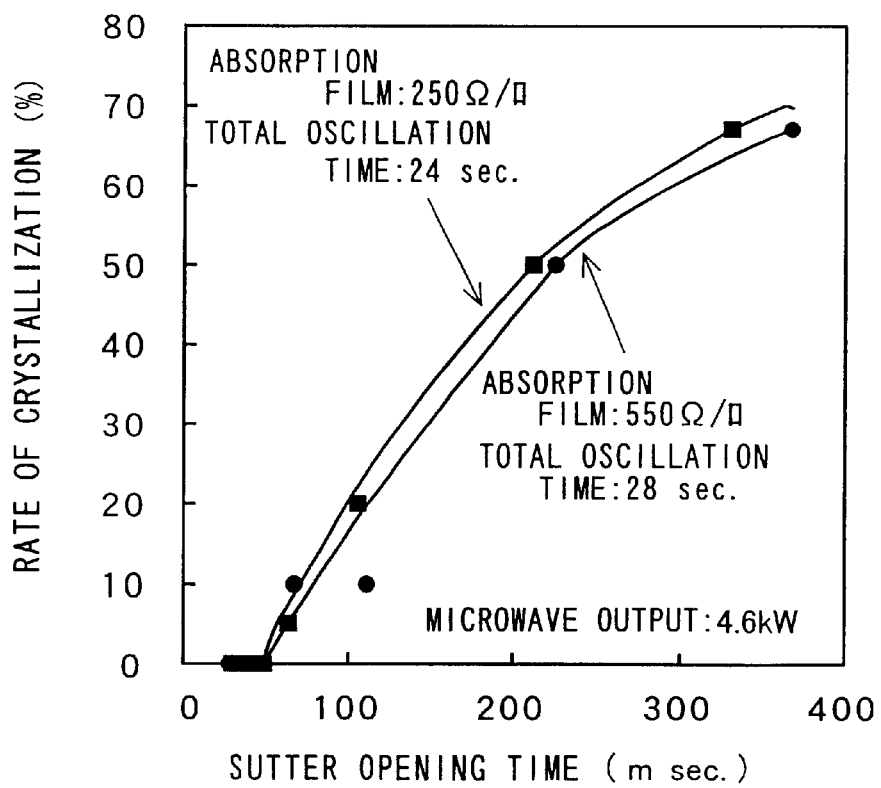
FIG. 7 is a characteristic diagram for illustrating an effect of the method of fabricating a semiconductor device according to the first embodiment of the present invention.

In the first embodiment, the rates of crystallization with respect to shutter opening times were investigated in two types of samples including absorption films 5 having sheet resistance values of 250Ω/ and 550Ω/ irradiated with microwaves at total oscillation times of 24 sec. and 28 sec. respectively according to the microwave application process shown in FIG. 6. FIG. 7 shows the relation between the ratios of areas of crystallization progressing portions of amorphous silicon films 3a according to the first embodiment and shutter opening times in a case of setting preheating and annealing times not to cause crystallization while closing shutters 11 and thereafter performing crystallization by opening/closing the shutters 11. Referring to FIG. 7, it is understood that the ratios of the areas of the crystallization progressing portions of the amorphous silicon films 3a were increased substantially in proportion to the shutter opening times. It has been proved that the amorphous silicon film 3a can be crystallized into the polycrystalline silicon film 3 by irradiating the same with the microwave for a short time of several 100 msec.

According to the first embodiment, as hereinabove described, the heat generated from the absorption film 5 irradiated with the microwave is utilized for indirectly heating the amorphous silicon film 3a, thereby crystallizing the same. The absorption film 5 has stable microwave absorptivity as well as a stable microwave output, whereby the microwave output absorbed by the absorption film 5 is uniformly stabilized. Consequently, the amorphous silicon film 3a can be substantially uniformly heated.

According to the first embodiment, the sample 100 is so arranged that the surface of the absorption film 5 is substantially parallel to the electric field in the rectangular wave guide 6 thereby improving the absorptivity of the absorption film 5 for the microwave, whereby the absorption film 5 can be efficiently heated. Thus, crystallization can be performed in a short time, for improving productivity.

(Second Embodiment)

A method of fabricating a semiconductor device according to a second embodiment of the present invention is described with reference to FIGS. 8 to 11. According to the second embodiment, a sample 100 to be crystallized is similar in structure to that according to the first embodiment.

First, an experimental device employed for the second embodiment is described with reference to FIG. 8. According to the second embodiment, a waveguide 21 arranged in a chamber 24 so that an end thereof is blocked with a chamber wall 22 is employed in place of the rectangular waveguide 6 in the experimental device according to the first embodiment shown in FIG. 3. The remaining part of the experimental device employed for the second embodiment is similar in structure to that of the experimental device employed for the first embodiment.

Figure 8:
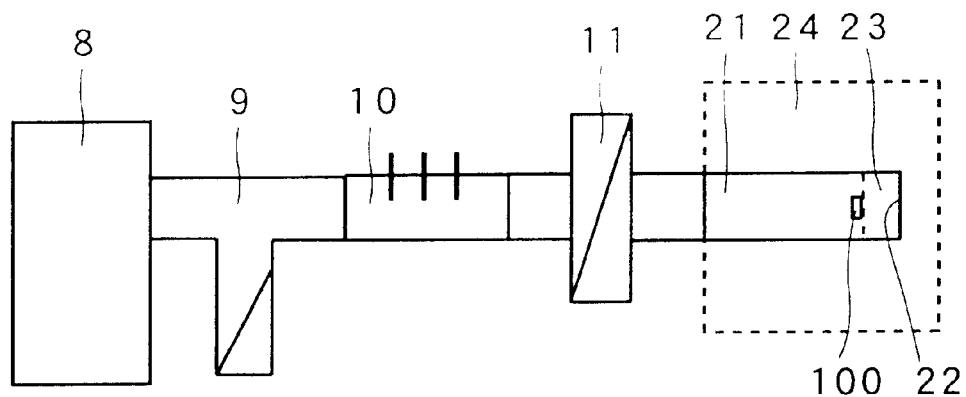
FIG. 8 schematically illustrates the overall structure of an experimental device employed for a second embodiment of the present invention.
Figure 9:
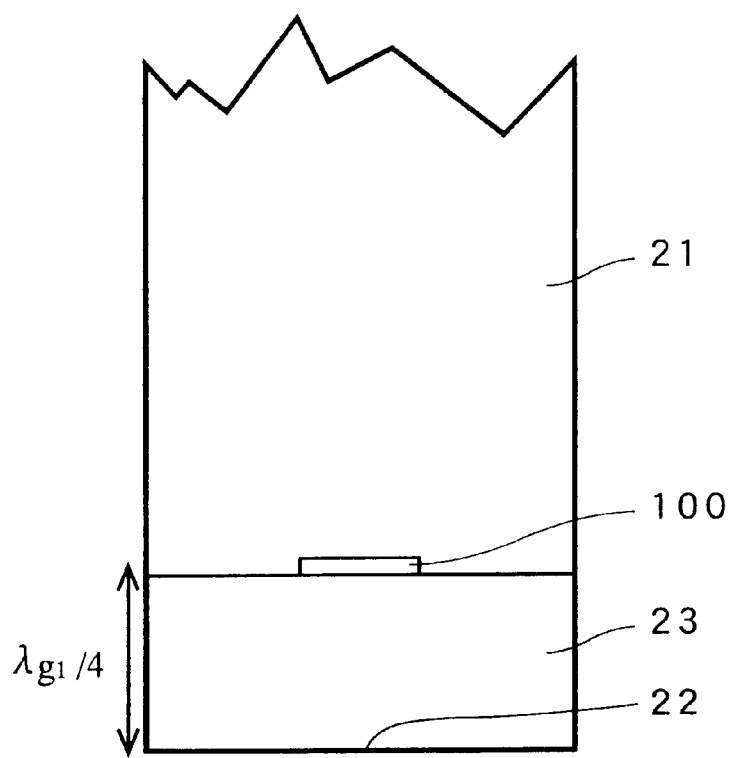
FIG. 9 is a schematic diagram for illustrating a method of fabricating a semiconductor device according to the second embodiment of the present invention.

FIG. 9 shows the waveguide 21 of the experimental device shown in FIG. 8 in detail. As shown in FIG. 9, an end of the waveguide 21 arranged in the chamber 24 (see FIG. 8) is blocked with the chamber wall (reflector) 22 consisting of a metal or the like. The aforementioned sample 100 is placed on a sample holder (not shown) of Teflon, which in turn is introduced onto a Teflon spacer 23 in the waveguide 21.

Figure 10:
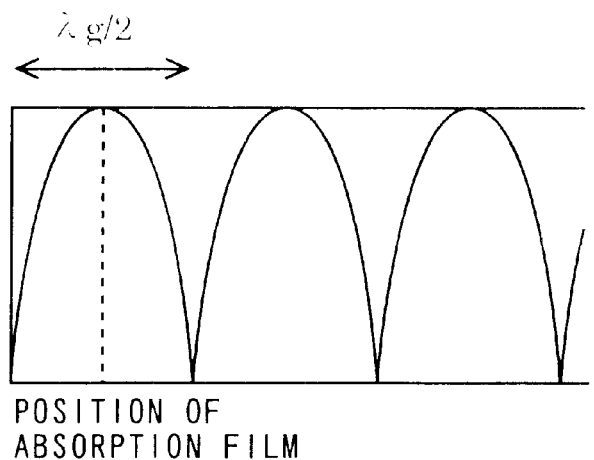
FIG. 10 is a model diagram for illustrating the principle of the method of fabricating a semiconductor device according to the second embodiment of the present invention.

The direction and the position for introducing the sample 100 according to the second embodiment are described with reference to FIG. 10. When a microwave is oscillated in the waveguide 21 having an end blocked with the chamber wall (reflector) 22, a standing wave is formed in the waveguide 21 as shown in FIG. 10. The chamber wall 22 reflects the microwave having a wavelength $\lambda g$ oscillated toward the chamber wall 22. Thus, the field strength of the microwave is increased on positions odd times ($\lambda g/4$, $3\lambda g/4$, $5\lambda g/4$, ... ) $\lambda g/4$ (¼ the wavelength $\lambda g$ of the microwave in the waveguide 21) from the chamber wall 22.

Reflectivity $S_0$ for the microwave in an absorption film 5 arranged on a position odd times $\lambda g/4$ from the chamber wall 22 is expressed as follows:

$$S_0 = (Rs - Z_0)/(Rs + Z_0) \quad (1)$$

where Rs represents the sheet resistance of the absorption film 5, and $Z_0$ represents spatial impedance, which is 377Ω in a free space. The microwave transmittance of the absorption film 5 is zero on the position of $\lambda g/4$, and hence the microwave absorptivity of the absorption film 5 is increased when the reflectivity $S_0$ is reduced. In other words, the microwave absorptivity of the absorption film 5 is maximized when $Rs = Z_0 = 377\Omega/$. The microwave reflectivity $S_1$ of the waveguide 21 is expressed as follows:

$$S_1 = (RS - Z_{cg})/(RS + Z_{cg}) \quad (2)$$

where $Z_{cg}$ represents spatial impedance in the waveguide 21, which is expressed as follows:

$$Z_{cg} = \frac{Z_0}{\sqrt{1 - (\lambda/2a)^2}} \quad (3)$$

where a represents the longitudinal size of a section of the waveguide 21. According to the second embodiment, $Z_{cg} = 457\Omega$ is obtained by substituting $Z_0 = 377\Omega/$, a=109 mm and $\lambda g = 122$ mm in the equation (3). Therefore, the reflectivity $S_1$ of the absorption film 5 in the waveguide 21 reaches zero when setting $Rs = Z_{cg} = 457\Omega$.

When the absorption film 5 is arranged in the waveguide 21 having the end blocked with the chamber wall (reflector) 22 on the position separated from the chamber wall 22 at the interval of substantially odd times $\lambda g/4$ (¼ the wavelength of the microwave) as hereinabove described, the absorption film 5 can be set on a position having strong field strength. Thus, the absorption film 5 can efficiently absorb the microwave. It has been proved that the microwave can be efficiently absorbed when the sheet resistance of the absorption film 5 is set to about 457Ω/.

According to the second embodiment, a wavelength $\lambda g_1$ is equal to $\lambda g \cdot \in^{1/2} = 99.6$ mm in consideration of the in-waveguide wavelength $\lambda g$ (147.8 mm) and the dielectric constant $\in$ (2.2) of Teflon, and hence the thickness of the Teflon spacer 23 is so adjusted as to arrange the absorption film 5 on a position separated from the chamber wall (reflection end) 22 by about 24.9 mm. The sample 100 is so arranged that the surface of the absorption film 5 is parallel to the chamber wall 22.

Then, the sample 100 located on the position of $\lambda g/4$ is irradiated with the microwave. Therefore, the absorption film 5 generates heat due to the applied microwave, and this heat is emitted from the absorption film 5 and diffused into an insulator film 4, to be substantially uniformly transmitted to an amorphous silicon film 3a. Thus, the amorphous silicon film 3a is substantially uniformly annealed and homogeneously crystallized with no dispersion, similarly to the first embodiment.

Figure 11:
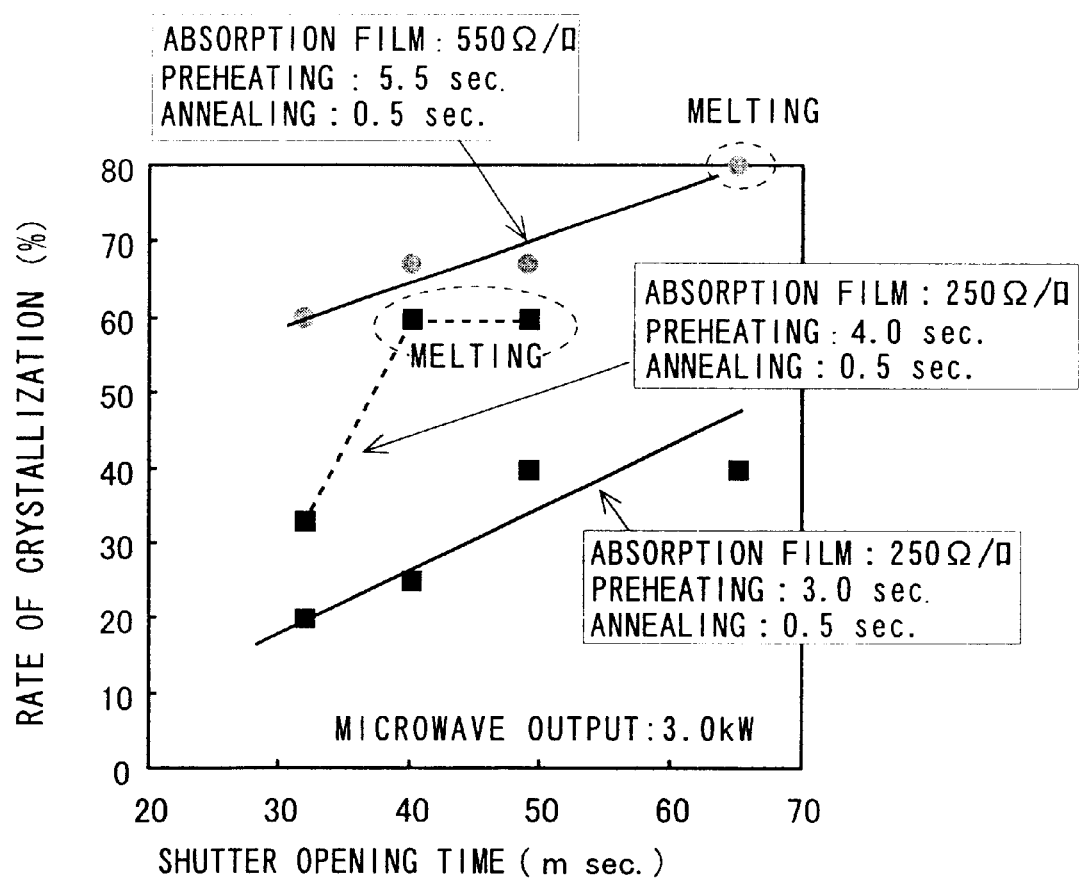
FIG. 11 is a characteristic diagram for illustrating an effect of the method of fabricating a semiconductor device according to the second embodiment of the present invention.

In relation to the second embodiment, the ratios of crystallization to shutter opening times were investigated on three samples including absorption films 5 having sheet resistance values of 250Ω/, 250Ω/ and 550Ω/ irradiated with microwaves preheated for 3.0 sec., 4.0 sec. and 5.5 sec. respectively through a process similar to the microwave application process according to the first embodiment shown in FIG. 6. The annealing times for the three samples were 0.5 sec. FIG. 11 shows the relation between the ratios of areas of crystallization progressing portions of amorphous silicon films 3a crystallized by setting preheating times and annealing times not to cause crystallization while closing shutters 11 and thereafter performing crystallization by opening/closing the shutters 11.

Referring to FIG. 11, it is understood that the ratios of the areas of the crystallization progressing portions of the amorphous silicon films 3a were increased substantially in proportion to the shutter opening times. When the absorption film 5 having the sheet resistance of 250Ω/ was irradiated with the microwave preheated for 4.0 sec., melting of the absorption film 5 was observed from a shutter opening time of about 40 msec. When the absorption film 5 having the sheet resistance of 550Ω/ was irradiated with the microwave preheated for 5.5 sec., melting of the absorption film 5 was observed from a shutter opening time of about 65 msec. In each of the three samples, it has been recognized that the amorphous silicon film 3a can be crystallized into a polycrystalline silicon film 3 in a shorter time than that in the first embodiment by irradiating the absorption film 5 with the microwave for a short time of several 10 msec. Thus, it has been proved that the absorption film 5 according to the second embodiment can absorb the microwave with higher efficiency than that in the first embodiment.

According to the second embodiment, absorptivity of the absorption film 5 for the microwave can be more improved by arranging the absorption film 5 on the position separated from the chamber wall 22 serving as the reflection end for the microwave at the interval of about $\lambda_g/4$ so that the surface thereof is parallel to the chamber wall 22, as hereinabove described. Thus, the absorption film 5 can be more efficiently heated. Consequently, crystallization can be performed in a shorter time as compared with the first embodiment, whereby productivity can be more improved.

According to the second embodiment, crystallization is performed by irradiating the absorption film 5 having stable absorptivity with the microwave having a stable output and indirectly heating the amorphous silicon film 3a through the heat stably generated from the absorption film 5, whereby the amorphous silicon film 3a can be substantially uniformly heated.

Although the present invention has been described and illustrated in detail, it is clearly understood that the same is by way of illustration and example only and is not to be taken by way of limitation, the spirit and scope of the present invention being limited only by the terms of the appended claims.

For example, while the shutter 11 is provided on part of the rectangular waveguide 6 for irradiating the miniature sample 100 arranged in the rectangular waveguide 6 with the microwave in the aforementioned first embodiment, the present invention is not restricted to this but a microwave oscillation source may alternatively instantaneously output a pulsing microwave. In order to irradiate a large-sized sample with a microwave, a branch may be provided for switching the microwave to a waveguide different from the waveguide 6, thereby controlling the microwave with a magnetic field or the like. Further alternatively, the absorption film 5 may be irradiated with a microwave while moving at least either the sample 100 or the microwave in place of applying a pulsing microwave.

Figure 12:
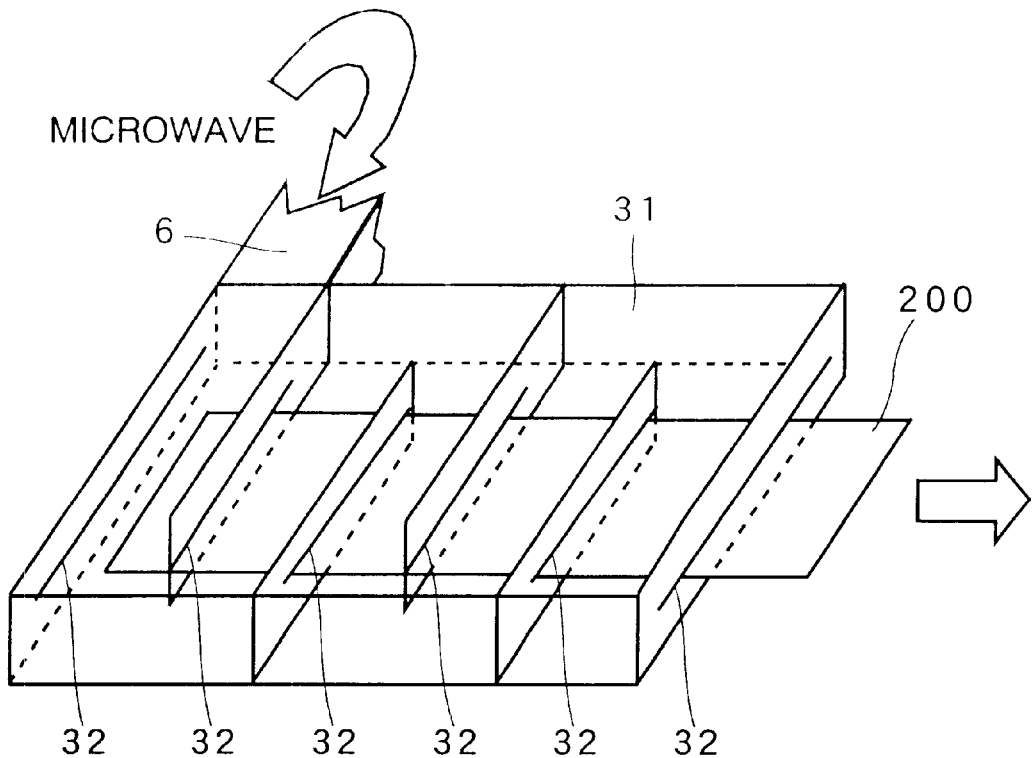
FIG. 12 schematically illustrates a method of fabricating a semiconductor device according to a modification of the first embodiment of the present invention.

FIG. 12 is a sectional view showing a waveguide 31 according to a modification of the first embodiment shown in FIG. 4. Referring to FIG. 12, a large-sized sample 200 is so arranged that the surface of an absorption film is substantially parallel to an electric field in the waveguide 31 in the modification of the first embodiment, similarly to the first embodiment shown in FIG. 4.

While the miniature sample 100 is arranged in the rectangular waveguide 6 according to the first embodiment shown in FIG. 4, the absorption film of the large-sized sample 200 is irradiated with a microwave while the sample 200 is moved in the modification of the first embodiment shown in FIG. 12. More specifically, the waveguide 31 different from a rectangular waveguide 6 is connected to the rectangular waveguide 6. This waveguide 31, formed by folding a linear waveguide a plurality of times, is provided with slots (openings) 32 on high-field portions of side surfaces thereof. The sample 200 is inserted into and passed through the slots 32, so that the absorption film of the large-sized sample 200 can be continuously irradiated with the microwave. Thus, the absorption film can be efficiently heated. Consequently, an effect similar to that of the first embodiment can be attained.

Figure 13:
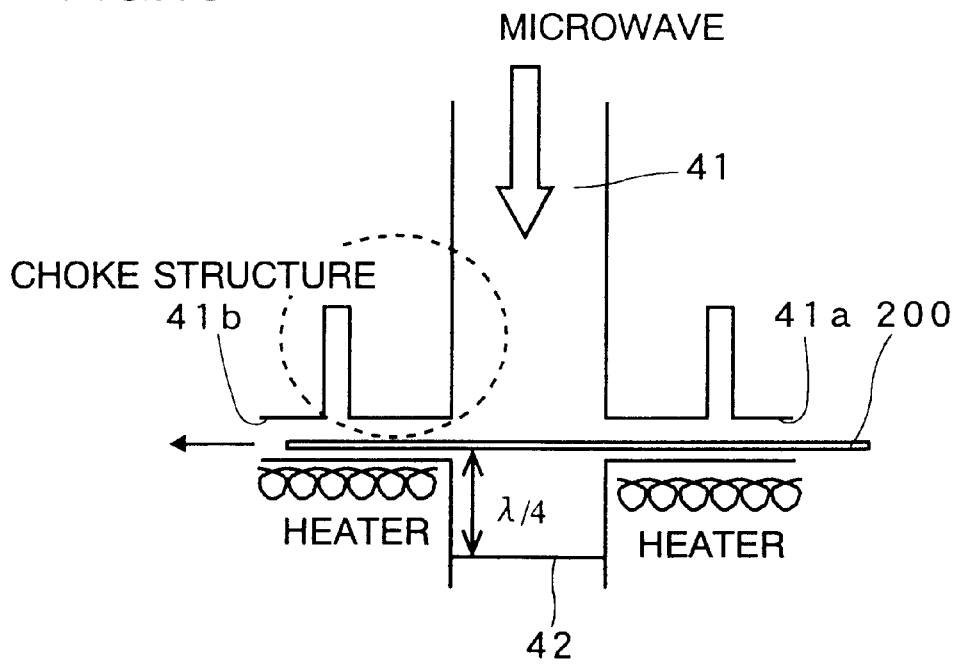
FIG. 13 schematically illustrates a method of fabricating a semiconductor device according to a first modification of the second embodiment of the present invention.

While the miniature sample 100 arranged on the position of $\lambda_g/4$ in the waveguide 21 is irradiated with the microwave in the aforementioned second embodiment, the present invention is not restricted to this but a large-sized sample may be moved and irradiated with a microwave. In a first modification of the second embodiment shown in FIG. 13, for example, an absorption film of a sample 200 is arranged on a position separated from a reflector 42 for a microwave substantially at an interval of $\lambda_g/4$, similarly to the second embodiment shown in FIG. 9. While the miniature sample 100 is arranged in the waveguide 21 according to the second embodiment shown in FIG. 9, the large-sized sample 200 is moved in a waveguide 41 and irradiated with a microwave according to the first modification of the second embodiment shown in FIG. 13.

More specifically, openings 41a and 41b are provided on parts of the waveguide 41. A reflector 42 consisting of a chamber wall or the like is provided perpendicularly to the direction of application of the microwave. When the large-sized sample 200 is inserted into the opening 41a and passed through a position separated from the reflector 42 by about $\lambda_g/4$, the absorption film of the sample 200 can be efficiently heated. Consequently, crystallization can be performed in a short time similarly to the second embodiment, whereby productivity can be improved. According to the first modification of the second embodiment, choke structures may be provided in the vicinity of the openings 41a and 41b for attaining a structure equivalent to that provided with no openings 41a and 41b in view of a high-frequency circuit. Thus, no leakage of the microwave or the like may be taken into consideration despite the openings 41a and 41b.

Figure 14:
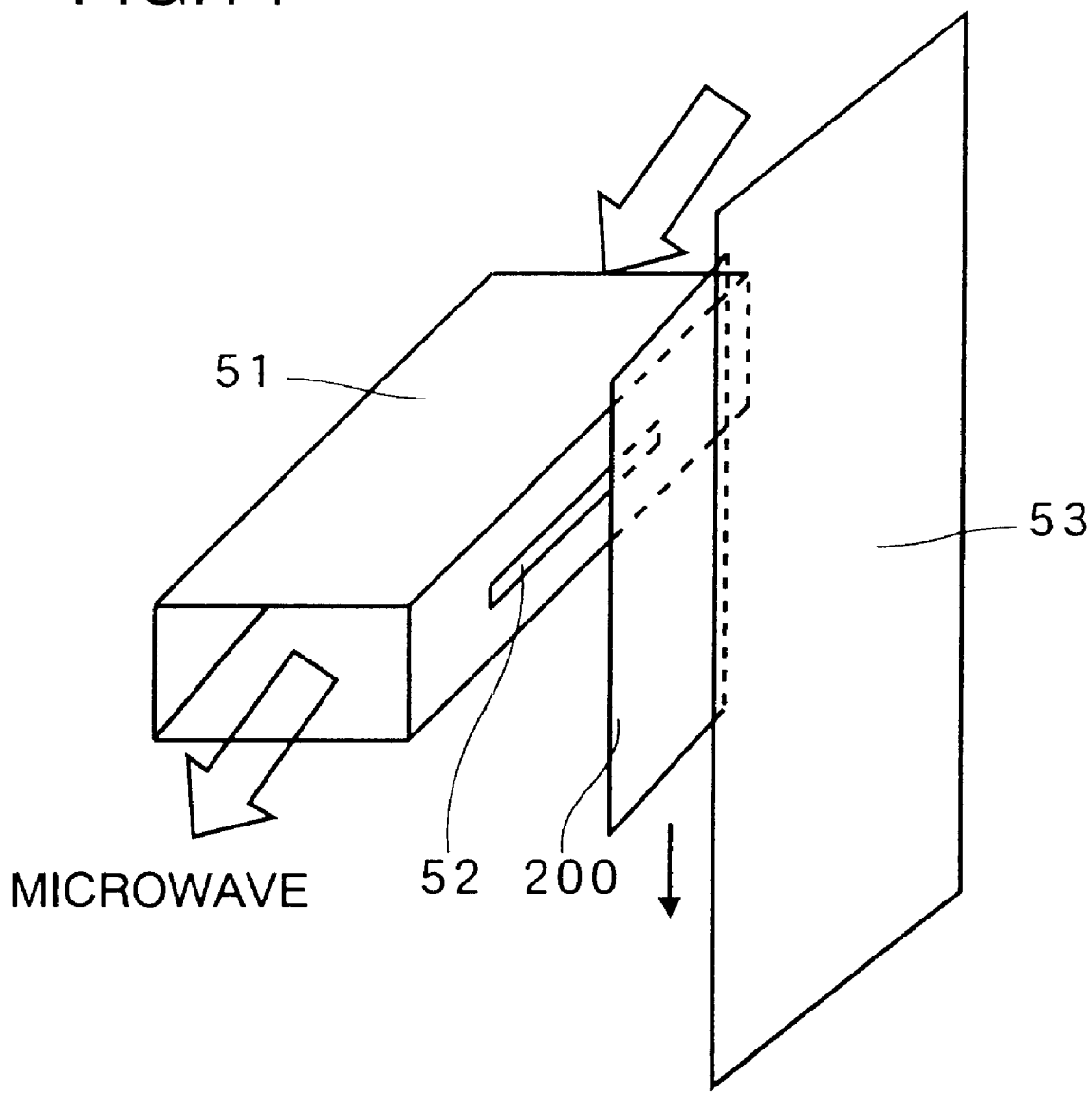
FIG. 14 schematically illustrates a method of fabricating a semiconductor device according to a second modification of the second embodiment of the present invention.

FIG. 14 schematically illustrates a waveguide 51 according to a second modification of the second embodiment shown in FIG. 9. Referring to FIG. 14, an absorption film of a sample 200 is arranged on a position separated from a reflector 53 for a microwave substantially at an interval of $\lambda/4$ similarly to the second embodiment shown in FIG. 9.

While the miniature sample 100 is arranged in the waveguide 21 according to the second embodiment shown in FIG. 9, the large-sized sample 200 is moved outside the waveguide 51 and irradiated with a microwave. More specifically, a slit 52 is provided on a high-field portion of a side surface of the waveguide 51. The reflector 53 consisting of a chamber wall or the like is provided perpendicularly to the direction of application of the microwave, to be opposed to the slit 52. The microwave emitted through the slit 52 is applied to the reflector 53, to generate a standing wave. When the large-sized sample 200 is passed through a position separated from the reflector 53 by about $\lambda/4$ in parallel with the reflector 53, therefore, an absorption film of the sample 200 can be efficiently heated. Consequently, crystallization can be performed in a short time similarly to the second embodiment, whereby productivity can be improved.

Figure 15:
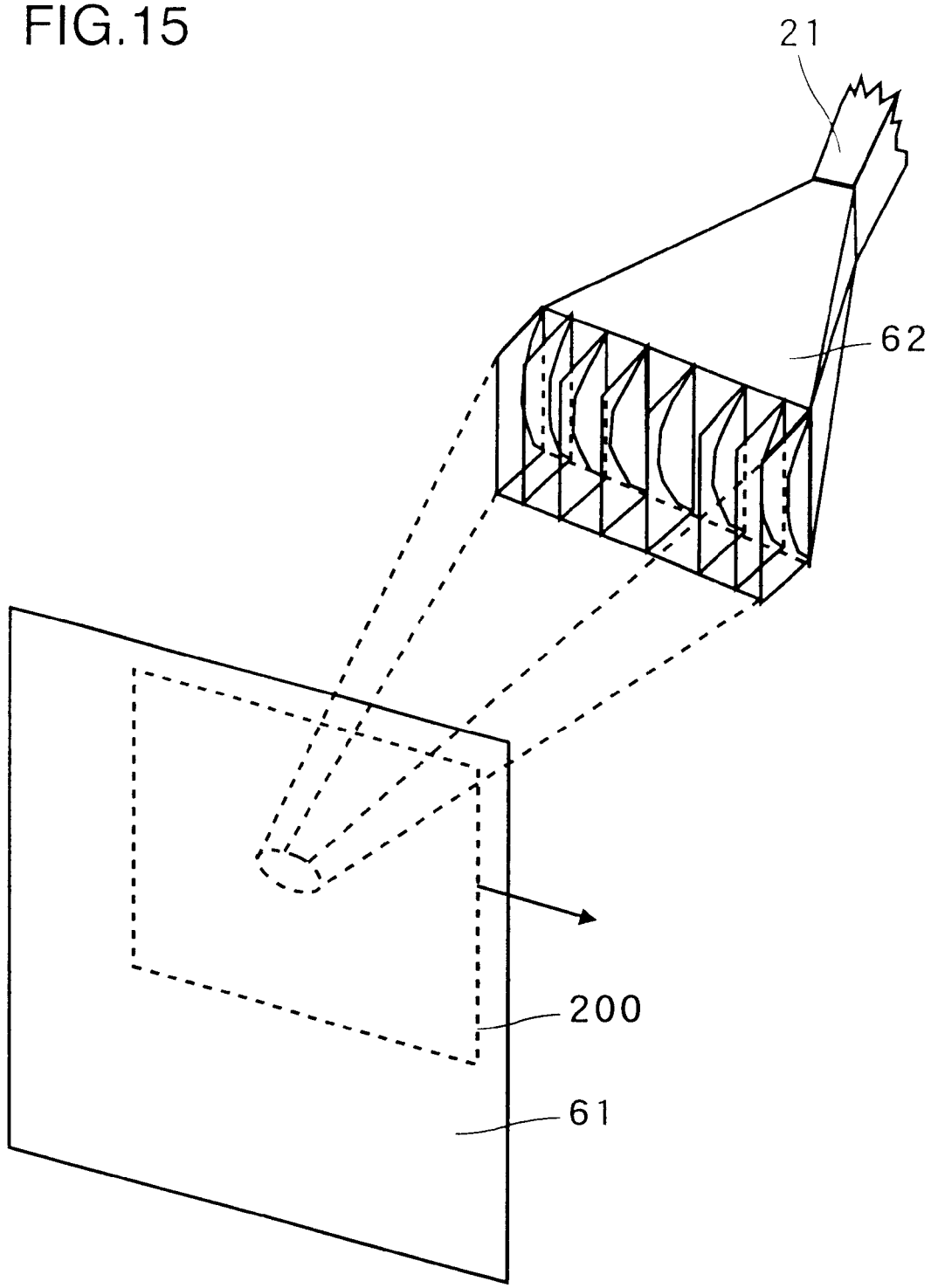
FIG. 15 schematically illustrates a method of fabricating a semiconductor device according to a third modification of the second embodiment of the present invention.

FIG. 15 schematically illustrates a waveguide 21 according to a third modification of the second embodiment shown in FIG. 9. Referring to FIG. 15, an absorption film of a sample 200 is arranged on a position separated from a reflector 61 for a microwave by about $\lambda/4$ according to the third modification of the second embodiment, similarly to the second embodiment shown in FIG. 9.

While the miniature sample 100 is arranged in the waveguide 21 according to the second embodiment shown in FIG. 9, a horn-type electromagnetic convergent lens 62 having a plurality of mid-feather walls provided on the forward end of the waveguide 21 is employed for irradiating the large-sized sample 200 with a microwave in the third modification of the second embodiment shown in FIG. 15. More specifically, the horn-type electromagnetic convergent lens 62 concentrates a linear or point microwave on the reflector 61. The reflector 61 consisting of a chamber wall or the like is provided on a direction perpendicular to that for applying the microwave, to be opposed to the horn-type electromagnetic convergent lens 62. The microwave concentrated by the horn-type electromagnetic convergent lens 62 is applied to the reflector 61, to generate a standing wave. When the large-sized sample 200 is passed through a position separated from the reflector 61 by about $\lambda/4$ in parallel with the reflector 61, therefore, the absorption film of the sample 200 can be efficiently heated. Consequently, crystallization can be performed in a short time similarly to the second embodiment, whereby productivity can be improved.

What is claimed is:

1. A method of fabricating a semiconductor device comprising steps of;
   forming an amorphous film on a substrate;
   forming a conductor film on said substrate;
   arranging said substrate so that the surface of said conductor film is substantially parallel to an electric field in a waveguide; and
   irradiating said conductor film with an electromagnetic wave thereby making said conductor film generate heat and crystallizing said amorphous film with said heat, wherein
      said step of arranging said substrate includes a step of arranging said substrate on a position seperated from a reflecting end surface for said electromagnetic wave at an interval of substantially odd times $\lambda/4$ assuming that $\lambda$ represents the wavelength of said electromagnetic wave.

2. The method of fabricating a semiconductor device according to claim 1, wherein
   said reflecting end surface for said electromagnetic wave includes a reflector provided to block an end of said waveguide.

3. The method of fabricating a semiconductor device according to claim 1, wherein
   said step of arranging said substrate includes a step of arranging said substrate while interposing a spacer member, transparent with respect to said electromagnetic wave, having a thickness of substantially odd times $\lambda/4$.

4. The method of fabricating a semiconductor device according to claim 1, wherein
   said step of crystallizing said amorphous film includes steps of:
      arranging an electromagnetic convergent lens on the forward end of said waveguide, and
      irradiating the surface of said conductor film with said electromagnetic wave converged by said electromagnetic convergent lens.

5. The method of fabricating a semiconductor device according to claim 4, wherein
   said step of crystallizing said amorphous film includes steps of:
      setting a reflector reflecting said electromagnetic wave, and
      irradiating said reflector with said electromagnetic wave converged by said electromagnetic convergent lens and moving said substrate in parallel with said reflector while maintaining a distance of substantially odd times $\lambda/4$ from said reflector for said electromagnetic wave.

6. The method of fabricating a semiconductor device according to claim 1, wherein
   said step of crystallizing said amorphous film includes a step of providing a slit in said waveguide and linearly emitting said electromagnetic wave from said slit of said waveguide thereby irradiating the surface of said conductor film with said electromagnetic wave.

7. The method of fabricating a semiconductor device according to claim 6, wherein
   said step of crystallizing said amorphous film includes steps of:
      setting a reflector reflecting said electromagnetic wave, and
      irradiating said reflector with said electromagnetic wave linearly emitted from said slit of said waveguide and moving said substrate in parallel with said reflector while maintaining a distance of substantially odd times $\lambda/4$ from said reflector for said electromagnetic wave.

8. The method of fabricating a semiconductor device according to claim 2, wherein
   said step of crystallizing said amorphous film includes a step of providing an opening for passing said substrate therethrough on said waveguide, providing a choke structure in the vicinity of said opening and inserting said substrate from said opening and passing said substrate through said waveguide while maintaining a distance of substantially odd times $\lambda/4$ from said reflecting end surface for said electromagnetic wave.

9. A method of fabricating a semiconductor device comprising steps of;
   forming an amorphous film on a substrate;
   forming a conductor film on said substrate;
   arranging said substrate so that the surface of said conductor film is substantially parallel to an electric field in a waveguide; and
   irradiating said conductor film with an electromagnetic wave thereby making said conductor film generate heat and crystallizing said amorphous film with said heat, wherein
      said step of crystallizing said amorphous film includes steps of:
         forming said waveguide by folding a linear waveguide a plurality of times while providing a purality of openings for passing said substrate therethrough on high-field portions of the side surface of said waveguide, and
         moving said substrate to pass through said plurality of openings.

10. A method of fabricating a semiconductor device comprising steps of;
    forming an amorphous film on a substrate;
    forming a conductor film on said substrate;
    arranging said substrate so that the surface of said conductor film is substantially parallel to an electric field in a waveguide; and
    irradiating said conductor film with an electromagnetic wave thereby making said conductor film generate heat and crystallizing said amorphous film with said heat, wherein
       said step of crystallizing said amorphous film includes a step of irradiating said conductor film with pulsing said electromagnetic wave thereby making said conductor film generate heat and crystallizing said amorphous film with said heat.

11. A method of fabricating a semiconductor device comprising steps of;

forming an amorphous film on a substrate;

forming a conductor film on said substrate;

arranging said substrate so that the surface of said conductor film is substantially parallel to an electric field in a waveguide; and irradiating said conductor film with an electromagnetic wave thereby making said conductor film generate heat and crystallizing said amorphous film with said heat, wherein said step of crystallizing said amorphous film includes a step of irradiating said conductor film with said electromagnetic wave while moving at least either said substrate formed with said conductor film or said electromagnetic wave thereby making said conductor film generate heat and crystallizing said amorphous film with said heat.

12. A method of fabricating a semiconductor device comprising steps of;

forming an amorphous film on a substrate;

forming a conductor film on said substrate;

arranging said substrate so that the surface of said conductor film is substantially parallel to an electric field in a waveguide; and irradiating said conductor film with an electromagnetic wave thereby making said conductor film generate heat and crystallizing said amorphous film with said heat, wherein said electromagnetic wave includes a microwave, and said conductor film includes a resistor film.

* * * * *